US009977848B1

(12) United States Patent
Wang (10) Patent No.: US 9,977,848 B1
(45) Date of Patent: May 22, 2018

(54) METHOD AND SYSTEM FOR PREDICTING ROCKET NOZZLE DEFORMATION DURING ENGINE START-UP AND SHUT-DOWN TRANSIENTS

(71) Applicant: The United States of America as Represented by the Administrator of the National Aeronautics and Space Administration, Washington, DC (US)

(72) Inventor: Ten-See Wang, Huntsville, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 671 days.

(21) Appl. No.: 14/553,234

(22) Filed: Nov. 25, 2014

Related U.S. Application Data (60) Provisional application No. 62/022,823, filed on Jul. 10, 2014.

(51) Int. Cl.
    *G06F 7/60* (2006.01)
    *G06F 17/50* (2006.01)
    *G06F 17/10* (2006.01)

(52) U.S. Cl.
    CPC .......... *G06F 17/5009* (2013.01); *G06F 17/10* (2013.01)

(58) Field of Classification Search
    CPC .................... G06F 17/5018; G06F 2217/16
    USPC .......................................... 703/2, 9
    See application file for complete search history.

(56) References Cited

U.S. PATENT DOCUMENTS

| 6,285,968 | B1 | 9/2001 | Motoyama et al. |
| 7,623,999 | B2 | 11/2009 | Clayton |
| 7,912,681 | B2 | 3/2011 | Narramore et al. |
| 7,941,300 | B1 | 5/2011 | Bowers |
| 8,041,547 | B2 | 10/2011 | Velazquez Lopez et al. |
| 8,060,350 | B2 | 11/2011 | Silva |
| 8,204,701 | B2 | 6/2012 | Yang et al. |
| 8,577,648 | B1 * | 11/2013 | Smith .............. G06F 17/13 703/2 |
| 2008/0275677 | A1 * | 11/2008 | Landon ............ G06F 17/5018 703/2 |
| 2014/0291441 | A1 * | 10/2014 | Bellotte ............ F42B 10/14 244/3.28 |

OTHER PUBLICATIONS

Wang, Ten-See et al., Development of an Aeroelastic Modeling Capability for Transient Nozzle Side Load Analysis, 49th AIAA/ASME/SAE/ASEE Joint Propulsion Conf., Jul. 14-17, 2014, AIAA 2013-3641, San Jose, CA, US.

* cited by examiner

*Primary Examiner* — Andy Ho
(74) *Attorney, Agent, or Firm* — James J. McGroary; Mark P. Dvorscak (57) ABSTRACT

Computational fluid dynamics (CFD) computations are performed at time increments using structural properties of the nozzle and flow properties of combustion products flowing through the nozzle. Each CFD computation accounts for movement of the wall geometry of the rocket nozzle due to the flowfield. Structural dynamics computations are performed at each time increment using the CFD computations in order to describe the movement of the wall geometry. Mesh dynamics computations at each time increment redefine the flowfield to account for the movement of the wall geometry. The mesh dynamics computations are based on a spring analogy process. The computations are iterated to solution convergence at each time increment with results being output to an output device.

12 Claims, 7 Drawing Sheets

2.81472 seconds 2.83900 seconds 2.86800 seconds 2.87538 seconds

METHOD AND SYSTEM FOR PREDICTING ROCKET NOZZLE DEFORMATION DURING ENGINE START-UP AND SHUT-DOWN TRANSIENTS

Pursuant to 35 U.S.C. § 119, the benefit of priority from provisional application 62/022,823, with a filing date of Jul. 10, 2014, is claimed for this non-provisional application.

ORIGIN OF THE INVENTION

The invention described herein was made by an employee of the United States Government and may be manufactured and used by and for the Government of the United States for governmental purposes without the payment of any royalties thereon of therefor.

BACKGROUND OF THE INVENTION

1. Field of the Invention

This invention relates to rocket nozzle side load analysis. More specifically, the invention is a method and system for predicting rocket nozzle deformation during the short-duration transient conditions associated with the flow of combusting propellants entering a rocket nozzle during rocket engine start-up and shut-down.

2. Description of the Related Art

Rocket engines generate thrust by combusting propellants in a combustion chamber to temperatures as high as 3500° K in a very short time (e.g., 3 to 5 seconds). During engine start-up, the combusting gases are expanded into the nozzle to become supersonic Mach disk flows. Until the thrust is fully generated when the nozzle is flowing full, the Mach disk flows generate aerodynamic side loads. During engine shut-down, the process is reversed and it is during the 3-5 seconds of shut-down transient, or when the Mach disk flow is being swallowed into the nozzle, that the Mach disk flow again naturally becomes asymmetric and produces aerodynamic side loads. Once the aerodynamic side loads are large enough to deform the nozzle structure, mechanical eigenmodes of the nozzle structure are excited thereby deforming the nozzle into mode shapes according to the excited eigenmodes. The deformed nozzle further changes the pressure distribution on the wall that, in turn, causes the traveling Mach disk flow to react and further excite the structural modes thereby causing oscillatory flexing of the nozzle structure. This type of fluid-structure interaction can generate damaging structural loads.

Typically, the mechanical nozzle structure has two discrete eigenmodes (i.e., the pendulum and bending modes) and a series of circumferential buckling eigenmodes (e.g., ovalization, triangular, square, etc.). The buckling modes are said to be triggered by the generation of the circumferentially moving conical shocks when the Mach disk wave travels near the nozzle lip. During a hot-fire test, the deformation of the nozzle structure is often the result of a combination of the lower frequency modes and lower order circumferential deformation modes; that is, the pendulum, first bending, ovalization, and triangular modes.

Lateral nozzle forces are known to cause severe structural damage to any new rocket engine in development during hot-fire tests or its maiden flight. Nozzle side load is therefore considered a high risk item and a critical design issue. Current nozzle design methodology includes attempts to predict nozzle side load using three-dimensional, transient, turbulent, chemically-reacting computational fluid dynamics on rigid nozzles. However, hot-fire tests often show oscillatory nozzle structural deformation during major side load events. This oscillatory nozzle structural deformation, also known as fluid-structure interaction or aeroelastic coupling, is the most important side load physics effect because it potentially leads to structural damage for weak nozzle structures. Yet fluid-structure interaction is not properly covered by the present rigid nozzle design methodology. Thus, the modeling picture of nozzle side load effects is incomplete without the ability to address the aeroelastic coupling effect.

Currently, side load physics indicative of rocket nozzle deformation is predicted using computational fluid dynamics and computational structural dynamics. Briefly, the computational fluid dynamics and computational structural dynamics are executed in different codes and only connected through an interface code. Computational structural dynamics and computational fluid dynamics codes are usually written based on a finite-element or finite-volume scheme, respectively. These schemes are very different in terms of how they assign the variables in the computational cells or grids. Accordingly, an interface code is needed to interpolate the values of the variables in order to transfer them between the codes. This creates inaccuracy due to the interpolation required at the fluid-structure interface. In addition, since three very different codes are involved, the actual computation is out-of-core. That means the computation is inefficient since iterations are needed among three codes with very different convergence criteria. For these reasons, these methods are categorized as loosely coupled models.

SUMMARY OF THE INVENTION

Accordingly, it is an object of the present invention to provide a method and system for predicting rocket nozzle deformation during engine start-up and shut-down transients.

Another object of the present invention is to provide a method of predicting rocket nozzle deformation that accounts for the fluid-structure interaction known as aeroelastic coupling.

Other objects and advantages of the present invention will become more obvious hereinafter in the specification and drawings.

In accordance with the present invention, a method and system are provided for predicting deformation of a rocket nozzle due to rocket engine combustion products flowing through the rocket nozzle during times associated with engine start-up and engine shut-down. The method uses a variety of input data to include structural parameters describing the rocket nozzle and wall geometry thereof, and flow properties generated by the rocket engine combustion products that will enter the rocket nozzle during the times associated with engine start-up and engine shut-down. A processing system includes at least one processor for implementing a plurality of programmed processing steps and at least one output device for presenting results generated by the programmed processing steps. The programmed processing steps include performing computational fluid dynamics (CFD) computations at time increments using the structural properties and flow properties wherein the CFD computations describe a flowfield associated with the rocket engine combustion products flowing through the rocket nozzle. Each of the CFD computations accounts for movement of the wall geometry of the rocket nozzle due to the flowfield. Next, structural dynamics computations are performed at each time increment using the CFD computations wherein the structural dynamics computations describe the movement of the wall geometry. Processing continues with the performance of mesh dynamics computations at each time increment to redefine the flowfield to account for the movement of the wall geometry. The mesh dynamics computations are based on a spring analogy process. The results of the programmed processing steps for at least one time increment are output to one or more output device(s).

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

A number of equations will be presented in the disclosure of the present invention. The variables used in the equations and their descriptions are as follows:
$C_1$, $C_2$, $C_3$, $C_\mu$=turbulence modeling constants, 1.15, 1.9, 0.25, and 0.09.
C=damping
$C_p$=heat capacity
D=diffusivity
$F_{yz}$, $F_y$, $F_z$=integrated force, and component forces in the lateral direction
f=frequency
H=total enthalpy
K=thermal conductivity or stiffness
k=turbulent kinetic energy
M=mass
Q=heat flux
r=Eigen function
T=temperature
t=time in seconds
u=mean velocities
$V^2=\Sigma u^2$
x=Cartesian coordinates or non-dimensional distance
Y=physical displacement
Z=generalized displacement
α=species mass fraction
ε=turbulent kinetic energy dissipation rate
μ=viscosity
$\mu_t$=turbulent eddy viscosity ($=\rho C_\mu k^2/\epsilon$)
ξ=damping parameter
Π=turbulent kinetic energy production
ρ=density
σ=turbulence modeling constants, 0.9, 0.9, 0.89, and 1.15 for Eqs. (2) and (4-6)
τ=shear stress
Φ=mode shape matrix
ω=chemical species production rate or natural frequency
The subscripts are defined as follows:
r=radiation
g=mesh movement
t=turbulent flow Referring now to the drawings and more particularly to FIG. 1, a flow diagram is shown of the method steps employed to predict rocket nozzle deformation during engine start-up and shut-down transients in accordance with an embodiment of the present invention. The method of the present invention includes a structural dynamics properties input process 10 and a fluid-structure iteration process 20. Briefly, structural dynamics properties input process 10 is executed one time to generate eigenvalues and eigenvectors that are input to fluid-structure iteration process 20 where they will be used to predict a nozzle's structural deformation during start-up and shut-down transients.

Figure 2:
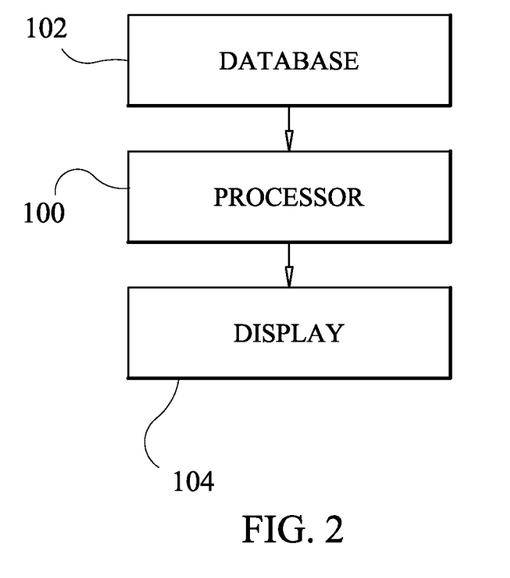
FIG. 2 is a block diagram of an exemplary system for carrying out the method of the present invention.

The processes described herein can be accomplished using one or more computers/processors and data storage devices without departing from the scope of the present invention. For example, FIG. 2 illustrates an exemplary system for carrying out the method of the present invention where a processor 100 is provided with needed data stored on a database 102. Processor 100 is programmed to execute the process steps (that will be described below) to generate predictions of rocket nozzle deformation during rocket engine start-up and shut-down transients. The predictions can be output as one or more of numerical data, graphic data, and image data on a display 104 or other appropriate output device(s) (e.g., printers, plotters, etc.), and/or could be stored (e.g., on database 102) for archival purposes without departing from the scope of the present invention.

Figure 1:
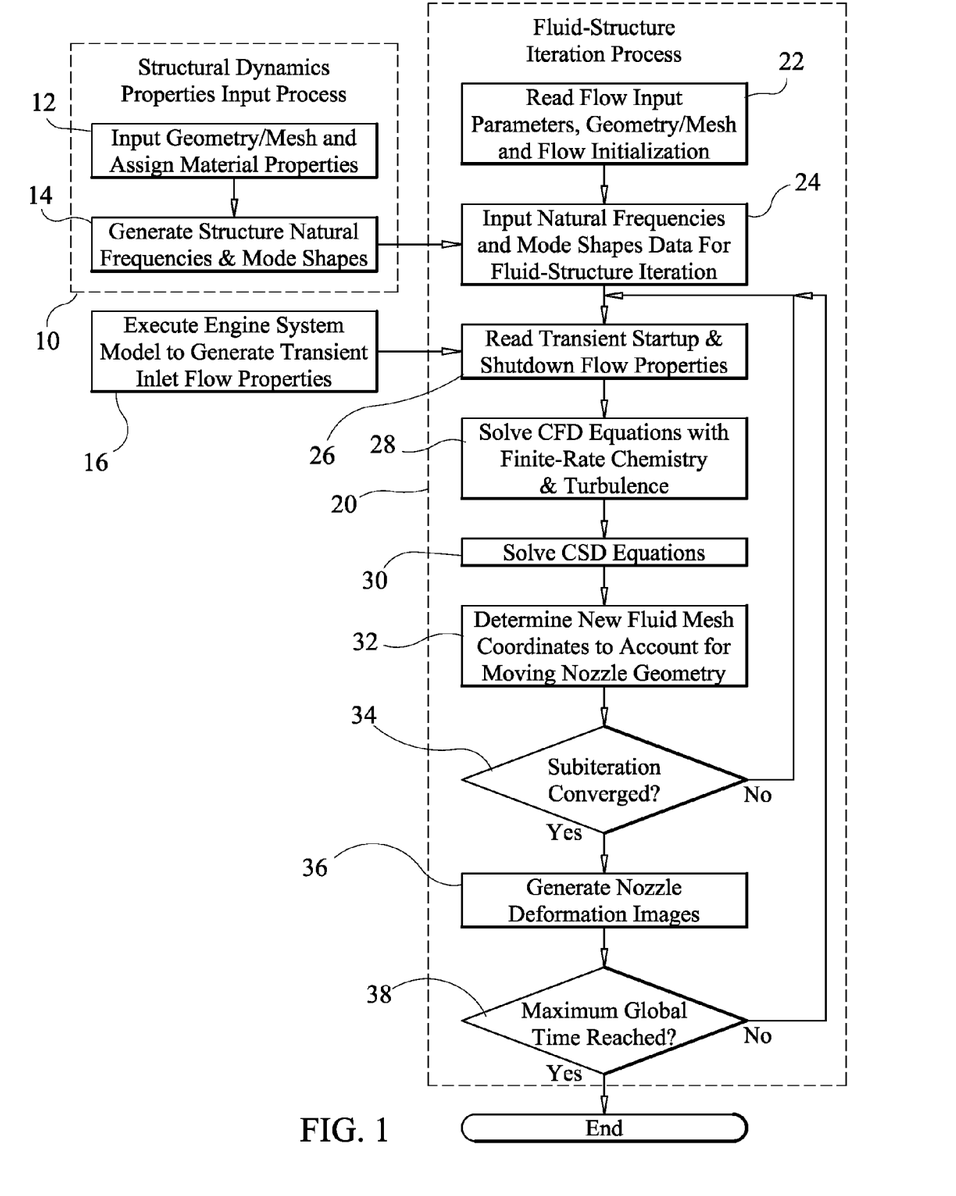
FIG. 1 is a flow diagram of a method of predicting rocket nozzle deformation during engine start-up and shut-down transients in accordance with an embodiment of the present invention.

Structural dynamics properties input process 10 requires a parametric description of the geometry of a rocket nozzle being evaluated and the properties of the material(s) used to construct the rocket nozzle. Such parameters are provided or modeled as indicated at step 12. In terms of modeling, a Finite Element Analysis (FEA) tool such as PATRAN can be used. PATRAN is an FEA modeling solution available from MCS Software Corporation, Newport Beach, Calif. The nozzle's geometry and material properties are provided to step 14 where the nozzle's natural frequencies and mode shapes (i.e., nozzle deformation possibilities) are generated. A multidisciplinary structural analysis tool can be used to implement step 14. One such analysis tool is NASTRAN available from MSC Software Corporation. However, there are many structural dynamics codes available that could be used to provide structural dynamics properties in input process 10. Accordingly, it is to be understood that the present invention is not limited to the use of PATRAN and NASTRAN to implement process steps 12 and 14, respectively, and that the method of the present invention could use any good structural dynamics code to provide structural dynamics properties.

Fluid-structure iteration process 20 begins at step 22 where flow input parameters and the nozzle's geometry/mesh and flow initialization parameters are provided. The flow input parameters include the time step used for each iteration of the process, the total number of steps to thereby define the maximum global time, orders of time and spatial accuracy, turbulence model selection, matrix solver selection, boundary conditions, number of species, species thermodynamics, and finite-rate chemistry kinetics. Output parameters such as formats and frequency of the outputs can also be provided or defined at this step.

As used herein, "geometry" refers to the contours (coordinates) of the nozzle geometry or nozzle wall contour. To compute the flow properties and solid nozzle wall properties, it is necessary to discretize the nozzle wall and flowfield moving through the nozzle into a "mesh" such that the properties on the mesh can be computed according to the boundary conditions. For a rigid nozzle assumption, the geometry and mesh are fixed during calculations. However, during transient start-up and shut-down conditions, the nozzle geometry deforms (into a combination of mode shapes) by the aerodynamic force (side load) imposed by the advancing transient Mach disk flow of the flowfield. The flowfield mesh moves in accordance with the deforming nozzle wall. Thus, the deformed nozzle geometry affects the Mach disk flow thereby again changing the side load imposed on the nozzle wall by the flowfield. The process repeats itself until the nozzle is flowing full. So in the fluid-structure interaction process, the nozzle "geometry" moves first, then the flowfield "mesh" moves accordingly. Therefore, the term "geometry/mesh" as used herein refers to the dynamic fluid-structure interaction process. The flow properties have to be assigned or initialized in order to start the transient calculation. For example, the entire flowfield can be initialized as quiescent air as would be the case in the real hot-fire test.

Fluid-structure iteration process 20 requires information about a rocket engine's input flow (i.e., the input flow generated by the rocket engine combustion products and entering the rocket nozzle being evaluated) during the transient start-up and shut-down time periods. Briefly, the transient inlet flow properties are time-varying flow properties specified at the flow inlet boundary (of the rocket engine's main combustion chamber) which fills the nozzle (with time-varying pressure ramping up) or evacuates the nozzle (with time-varying pressure ramping down) during the transient periods. During the start-up transient, the pressure gradually increases until a Mach disk (normal shock) flow emerges. The Mach disk flow advances in time until it pushes all the air out of the nozzle. During the shut-down transient, the pressure at the rocket engine's injector faceplate ramps down thereby reversing the process as the Mach disk flow retracts back into the rocket engine's main combustion chamber.

The above-described rocket engine's transient input flow is generated at step 16 where a rocket engine system model is executed to generate the transient flow properties (i.e., those associated with start-up transients and shut-down transients) that would be provided to the inlet of the rocket nozzle being evaluated. These short-duration properties of a rocket engine can be generated by a variety of simulation tools known in the art. Two known simulation tools are disclosed in "System Design Specification for ROCETS (Rocket Engine Transient Simulation) System," United Technologies Corporation, Pratt and Whitney Government Engine Business, Vols. I and II, Contract NASA-36944, Pratt and Whitney, 1990, and "Generalized Fluid System Simulation Program, Version 6.0," A. K. Majumdar et al., NASA/TM-2013-217492, NASA Marshall Space Flight Center, Alabama 35812, October 2013.

Transient system-level simulation provided by step 16 is a vital part of the computational methodology because it provides the time-histories of the inflow properties entering the nozzle. Simply put, the ramp rates (or histories) of the inlet pressure, fluid temperature and species concentrations, play an important role in determining the type of flow physics and the magnitude/duration of the flow physics during the transient operations. In other words, the time-varying inlet flow properties determine the residence times of the flow physics inside the nozzle.

Figure 3:
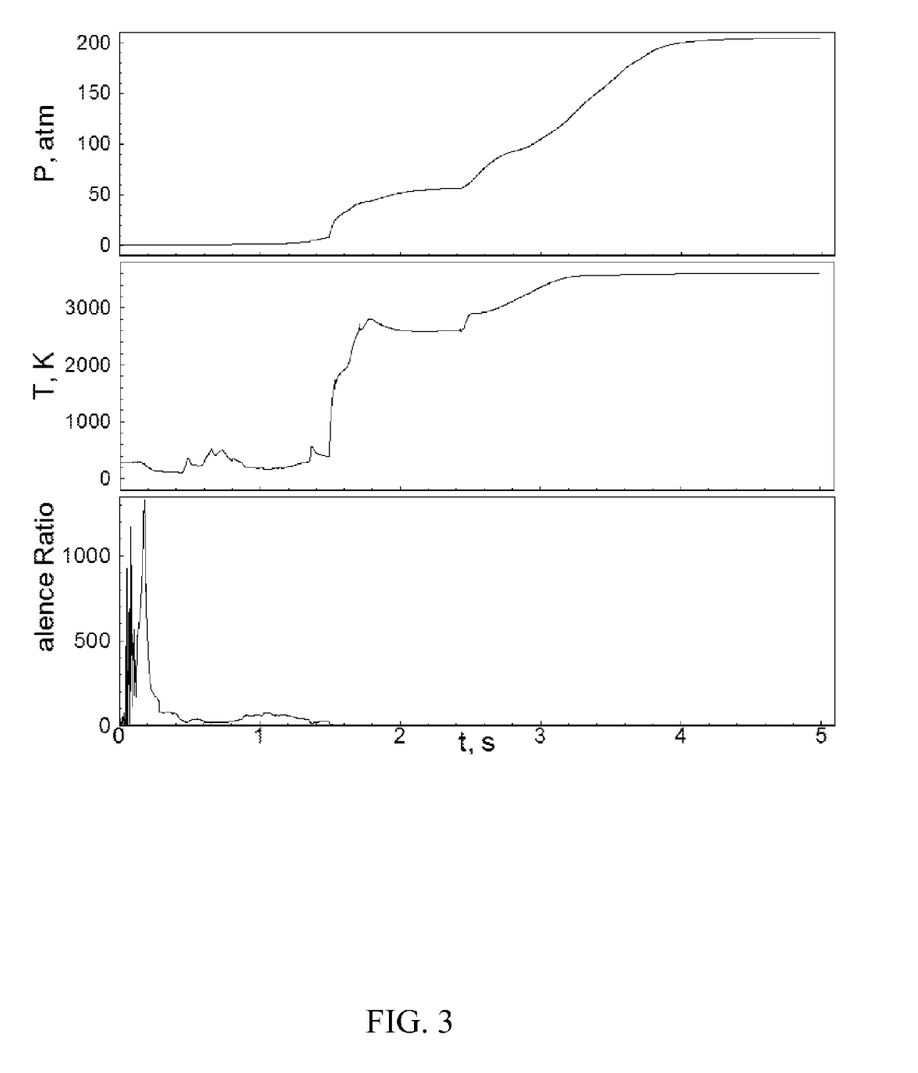
FIG. 3 is a graphic illustration of thruster chamber inlet properties during an exemplary start-up transient.

System-level simulation can be based on a lumped, control-volume approach to model the rocket engine as a network of components and sub-components. This method of transient system-level modeling has been shown to be effective in simulating the low-frequency, transient physics associated with the operation of previous and existing rocket engines and, therefore, is an important tool in the design and planning of sequencing the transient events of rocket engine operation. By way of an illustrative example, FIG. 3 shows the major inlet flow properties obtained from a system model executing in step 16, i.e., time-varying inlet pressure profile, temperature profile, and chemical species concentration profile that is presented in FIG. 3 as equivalence ratio (also known as a fuel/oxidizer ratio) over a stoichiometric fuel/air ratio. Note that the scales used when displaying these profiles can be adjusted as needed to illustrate important information. These time-varying inlet properties are those that would be present at the injector faceplate of the thrust chamber for the computational fluid dynamics (CFD) computation. An exemplary start-up transient process can include thermal-fluid physics phenomena and safety-based operating practices that are typical of a conventional liquid hydrogen/liquid oxygen rocket engine.

In the illustrated example, two significant pressure rise events can be identified in the inlet pressure history. The first one occurs at 1.5 seconds and is due to oxygen prime, while the second one occurs at about 2.4 seconds and is caused by the step opening of the oxygen valves in the rocket engine's pre-burners. The inlet temperature history shows a sharp jump at 1.5 seconds, a leveling off after 1.75 seconds, another small rise at 2.4 seconds, and linear increase until around 3.1 seconds at which point the final temperature is achieved. The inlet equivalence ratio history shows that the thruster environment is fuel rich throughout the start-up transient, especially in the first 1.5 seconds thereby setting up the potential for afterburning. This event turns out to be the source of a combustion wave because the pressure jump at 1.5 seconds increases the reaction rate of afterburning that, in turn, leads to the generation of the combustion wave. Afterburning plays an important part in the subsequent asymmetric flow physics such as the shock transitions and shock breathings across the nozzle lip.

Once the present invention's transient calculation starts at time zero, the above-described properties from process 10 are provided to process 20 at step 24. The above-described transient inlet flow properties from the execution of step 16 are provided to process 20 at step 26. The provision of data inputs to process 20 can be accomplished in a variety of ways known in the art without departing from the scope of the present invention. For example, the results of process 10 and step 16 could be stored in database 102 which could then be accessed by processor 100 during execution of process 20.

Step 28 implements a new CFD process that accounts for movement of the rocket nozzle's walls during transient flow through the nozzle, and accounts for finite-rate chemistry and turbulence. The novel CFD methodology is based on a multi-dimensional, finite-volume, viscous, chemically-reacting, unstructured grid, and pressure-based formulation. Time-varying transport equations of continuity (Equation (1)), species continuity (Equation (2)), momentum (Equation (3)), total enthalpy (Equation (4)), turbulent kinetic energy (Equation (5)), and turbulent kinetic energy dissipation (Equation (6)) were solved using a time-marching sub-iteration scheme and are written as follows:

$$\frac{\partial \rho}{\partial t} + \frac{\partial}{\partial x_j}[\rho(u_j - u_{jg})] = 0 \tag{1}$$

$$\frac{\partial \rho \alpha_i}{\partial t} + \frac{\partial}{\partial x_j}[\rho(u_j - u_{jg})\alpha_i] = \frac{\partial}{\partial x_j}\left[\left(\rho D + \frac{\mu_t}{\sigma_\alpha}\right)\frac{\partial \alpha_i}{\partial x_j}\right] + \omega_i \tag{2}$$

$$\frac{\partial \rho u_i}{\partial t} + \frac{\partial}{\partial x_j}[\rho(u_j - u_{jg})u_i] = -\frac{\partial p}{\partial x_i} + \frac{\partial \tau_{ij}}{\partial x_j} \tag{3}$$

$$\frac{\partial \rho H}{\partial t} + \frac{\partial}{\partial x_j}[\rho(u_j - u_{jg})H] = \frac{\partial p}{\partial t} + Q_r + \tag{4}$$

$$\frac{\partial}{\partial x_j}\left(\left(\frac{K}{C_p} + \frac{\mu_t}{\sigma_\pi}\right)\nabla H\right) + \frac{\partial}{\partial x_j}\left((\mu + \mu_t) - \left(\frac{K}{C_p} + \frac{\mu_t}{\sigma_\pi}\right)\right)\nabla(V^2/2) +$$

$$\frac{\partial}{\partial x_j}\left(\left(\frac{K}{C_p} + \frac{\mu_t}{\sigma_H}\right)\left(u_k\frac{\partial u_j}{\partial x_k} - \frac{2}{3}u_j\frac{\partial u_k}{\partial x_k}\right)\right)$$

$$\frac{\partial \rho k}{\partial t} + \frac{\partial}{\partial x_j}[\rho(u_j - u_{jg})k] = \frac{\partial}{\partial x_j}\left[\left(\mu + \frac{\mu_t}{\sigma_k}\right)\frac{\partial k}{\partial x_j}\right] + \rho(\Pi - \varepsilon) \tag{5}$$

$$\frac{\partial \rho \varepsilon}{\partial t} + \frac{\partial}{\partial x_j}[\rho(u_j - u_{jg})\varepsilon] = \tag{6}$$

$$\frac{\partial}{\partial x_j}\left[\left(\mu + \frac{\mu_t}{\sigma_\varepsilon}\right)\frac{\partial \varepsilon}{\partial x_j}\right] + \rho\frac{\varepsilon}{k}(C_1\Pi - C_2\varepsilon + C_3\Pi^2/\varepsilon)$$

Briefly, the present invention's introduction of the $u_{jg}$ mesh velocity term accounts for movement of the mesh, i.e., nozzle movement due to the transient flowfield moving through the nozzle. The chemical species production rate term, $\omega_i$, accounts for the local chemical species composition due to the finite-rate, afterburning reactions occurring at the mixing layer between the excess fuel and the ambient air. Turbulence is accounted for by solving an extended two-equation turbulence model represented by Equations (5) and (6). This turbulence model enhances the development of turbulent kinetic energy dissipation when the main strain (i.e., a function of mean flow velocity gradients) is strong, and the generation of dissipation is suppressed when the main strain is weak. As a result, the present invention controls the development of the turbulent kinetic energy more effectively which is important for separated supersonic flows in transient nozzle operations. It is emphasized that turbulence controls the mixing rate between the excess fuel and air to thereby control the chemical species production rate or the heat release during afterburning that dictates the shock pattern of the Mach disk flow and, in turn, the nozzle side load.

Step 30 generates a computational structural dynamics (CSD) response by solving conventional structure deflection equations. Briefly, the structural dynamics response due to fluid flow actions generated at step 28 can be analyzed using direct finite-element analysis. The known aeroelastic equation of motion of solid bodies is given by $$[M]\{\ddot{Y}\} + [C]\{\dot{Y}\}[K]\{Y\} = \{F\} \tag{7}$$

where $\{Y\}$ is the displacement vector, $[M]$ is the mass matrix, $[C]$ is the damping matrix, $[K]$ is the stiffness matrix, and $\{F\}$ is the force vector acting on the rocket nozzle due to the aerodynamic loads and shear stresses developed from the CFD computations generated at step 28.

The motion of the structure described by Equation (7) can be solved using a modal approach. On the basis of modal decomposition of the structure motion with the eigenvectors of the vibration problem, the displacement, velocity and acceleration can be transformed to the generalized displacement, velocity and acceleration using a transformation matrix, which can be expressed as follows:

$$\{Y\} = [\Phi]\{Z\}; \quad \{\dot{Y}\} = [\Phi]\{\dot{Z}\}; \quad \{\ddot{Y}\} = [\Phi]\{\ddot{Z}\} \tag{8}$$

Here, $[\Phi]$ is the mode shape matrix containing the eigenvectors orthonormalized with the mass matrix, and $\{Z\}$, $\{\dot{Z}\}$, and $\{\ddot{Z}\}$ are the generalized displacement, velocity and acceleration vectors, respectively. The eigenvectors are orthogonal to both mass and stiffness matrices and, if Rayleigh damping is assumed, are also orthogonal to the damping matrix. Pre-multiplying Equation (8) by $[\Phi]^T$ yields $$\{\ddot{Z}\} + [\Phi]^T[C][\Phi]\{\dot{Z}\} + [\Phi]^T[K][\Phi]\{Z\} = [\Phi]^T\{F\} \tag{9}$$

where $$[\Phi]^T[M][\Phi] = 1$$

Equation (9) can be written as n individual equations, one for each mode, as follows $$\begin{cases} \ddot{z}_i + 2\xi_i\omega_i\dot{z}_i + \omega_i^2 z_i = r_i \\ r_i = \Phi_i^T\{F\} \end{cases} i = 1, 2, \ldots, n \tag{10}$$

Here, $\omega_i$ is the natural frequency for the i-th mode and $\xi_i$ is the corresponding damping parameter for that mode. The solution to Equation (10) can be obtained for each mode using direct integration algorithm. In general, the first several mode shapes (i.e., ovalization, bending, triangle, and square) are most important. Known structural dynamics software (such as the above-mentioned NASTRAN) can be employed to extract the Eigen modes and Eigen frequencies.

As explained above, a flowfield also deforms as it moves through a deforming nozzle. In order to maintain boundary and grid conformity at the fluid-structure interface, the present invention redefines the flowfield grid to reflect the motion of the fluid-structure interfaces. Accordingly, step 32 computes new mesh coordinates using computational mesh dynamics to account for the moving nozzle geometry. Briefly, the present invention applies a spring analogy approach that re-models nodes of the mesh. The geometric and inertial effects of the motions of deforming structures are fed into the flowfield through the varying fluid-dynamic boundary conditions at the surface of structures to thereby account for the locations and the velocities of these surfaces. In addition, in order to maintain boundary and grid conformity at the fluid-structure interface, the flowfield grid must be deformed to reflect the motion of the fluid-structure interfaces. The new coordinates of the fluid mesh nodes are computed by a computational mesh dynamics procedure. In the present invention, the flowfield grid is deformed at every fluid-structure data exchange that is carried out once at the end of every global time-step to continuously accommodate the deformed shape of the structures in the aeroelastic model. The deformation of the fluid-dynamic grid in the present invention is accomplished by using a spring analogy approach.

As is known in the art, the spring analogy approach assumes that the mesh nodes are connected like a network of springs. See, for example, "Mesh generation and deformation algorithm for aeroelasticity simulations," A. Cizmas et al., Journal of Aircraft, Vol. 45, No. 3, 2008, pp. 1062-1066. Briefly, by performing a force balance on each of the "spring elements", an equilibrium balance is sought which provides a smooth mesh. If two elements (nodes) are too close, the spring force will repel the nodes away from each other. Since each nodal position depends on its neighboring nodes, the boundary deformation effects are felt throughout the mesh domain. Therefore, when the geometries of the boundary nodes are changed, the distributed spring system settles the interior nodes into a new equilibrium state which can be modeled by the following spring balance equation $$\sum_{j=1}^{N_i} k_{ij}(\delta_i - \delta_j) = 0 \qquad (11)$$

for all nodes i in the field. In the spring balance Equation (11), $\delta_i$ and $\delta_j$ are the coordinate displacements of node i and its neighboring node j, respectively. $N_i$ is the number of neighboring nodes connected to node i, and $k_{ij}$ is the spring stiffness for a given edge between i to j which is taken to be inversely proportionally to the length of the edge as $$k_{ij} = \frac{1}{\sqrt{(x_i - x_j)^2 + (y_i - y_j)^2 + (z_i - z_j)^2}} \qquad (12)$$

It is noted that all turbulence models require off-wall spacing to be specified at a certain range in order to maintain the accuracy of the turbulence calculation. Although the conventional spring analogy is proficient in the general grid spacing in the flowfield, it does not ensure the required off-wall grid spacing. To account for this, a novel grid spacing method is used in this invention to ensure that the required off-wall spacing is maintained. Briefly, the grid spacing method used in the present invention achieves the objective of keeping the off-wall grid spacing by multiplying the $k_{ij}$ of the spring balance Equation (11) by a weighting function. The weighting function is a smooth function that acts like spring constant. The weighting function has values ranging from greater than unity to unity, and varies in a direction normal to the rocket wall. More specifically, the weighting function has a large value greater than unity at the rocket wall and then decreases smoothly to unity at the flowfield's boundary layer edge. By weighting near-wall cells with a large spring constant value, the coordinate displacements of the near-wall grid points will follow the wall displacements very closely thereby keeping the near-wall grid spacing equivalent to that of the original mesh.

The above-described steps 28, 30 and 32 are iterated until there is solution convergence at each time step (or "subiteration") that is checked/verified at step 34. Note that after each time step, the transient flow properties from step 16 are read at step 26 to update the new boundary condition at the main combustion chamber inlet.

The subiteration method of the present invention ensures the solution converges at every time step. Transient flow solution is different from that of the steady-state flow solution. The steady-state flow has only one final solution. However, for transient flows such as engine start-up and shut-down, the major side load events occur at least two times in the entire time span corresponding to the major side load physics such as shock transitions, shock oscillations at the nozzle lip, and separation line jump. Accordingly, every time slice is important and needs to be converged with the subiteration method described herein.

The present invention solves transient, nonlinear, coupled, partial differential equations, with predetermined boundary conditions, including the transient inlet conditions. For a computer (such as processor 100) to solve these equations in time and in three-dimensional coordinates, these equations need to be discretized at every time slice and for all grid points of the entire computational domain. Most of the discretized equations need to be solved iteratively until certain requirements are met at each time step (e.g., the parameter being solved for at a current time step is within a specified tolerance when compared to the same parameter from the previous time step) in order to maintain the accuracy and stability of the computation. If all the requirements are met at a particular time step, then the solution is said to have "converged" and it is safe to proceed to do the computation for the next time step until the final elapsed time is reached. When the solution does not converge, or "diverges", then the flow properties (e.g., pressure) will oscillate at increasing amplitude. Eventually, the value of the flow property at certain area becomes infinite which is indicative of non-physical data. When this occurs, the computation is deemed to have failed and must be restarted using, for example, a smaller time step. Thus, a converged solution is an accurate and stable solution. When the solution is converged at a time step, the process continues to compute the solution at the next time step. The elapsed time will be the accumulation of all the time steps computed up to that point.

Transient nozzle side load computation is difficult owing to the many time-varying solutions that must be converged and stored. By way of example, assume there is a time step of $10^{-5}$ seconds specified in step 22. Accordingly, the global time increases by $10^{-5}$ seconds whenever there is a converged subiteration. Assume further that the nozzle side load action occurs between global times 1.4 seconds and about 3.8 seconds (e.g., see the example in FIG. 3). For this example, it takes 140,000 steps to reach global time of 1.4 seconds, 280,000 steps to finish the side load action at 2.8 seconds, and 500,000 steps to complete the full transient start-up calculation at 5 seconds. The entire solution process will not be stopped until the maximum time (e.g., of 5 seconds) is reached at step 38.

Figure 4:
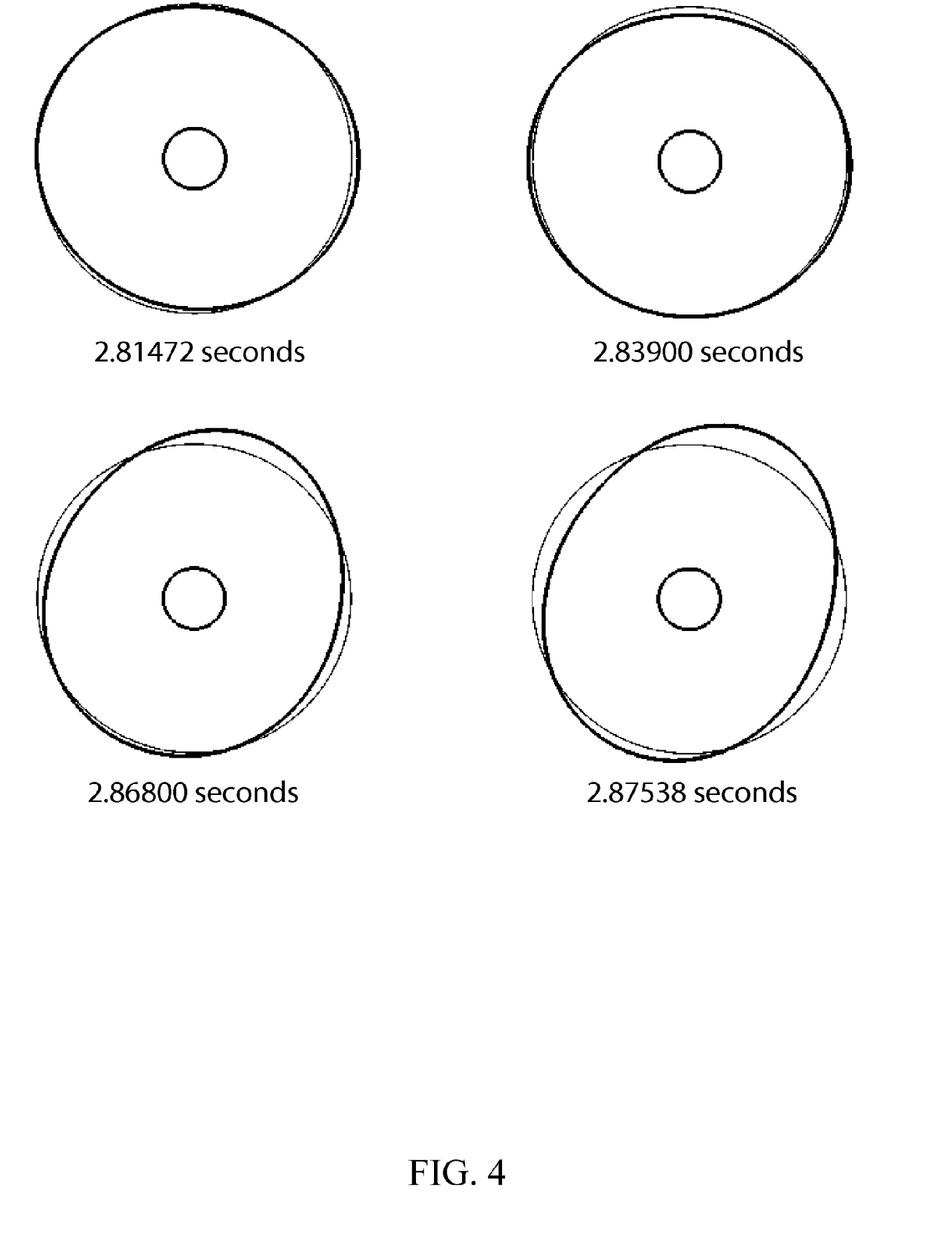
FIG. 4 presents end view images of a rocket nozzle's deformation predictions generated by the method of the present invention.
Figure 5:
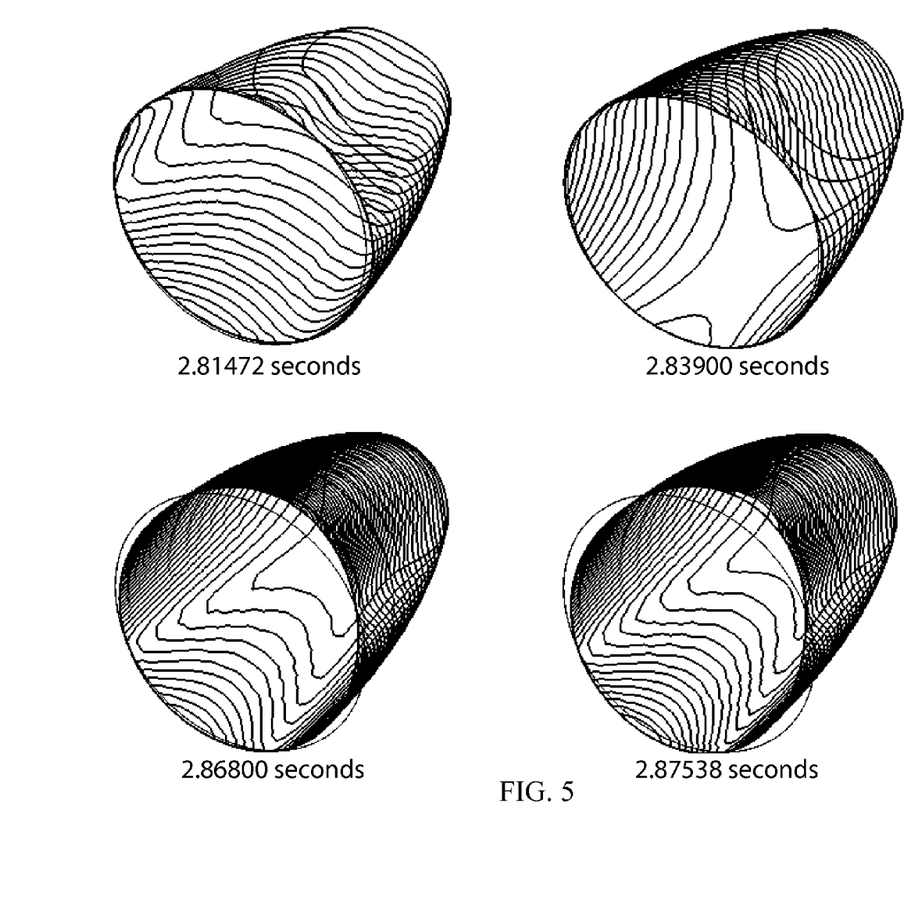
FIG. 5 presents perspective view images of the rocket nozzle's deformation predictions
Figure 6:
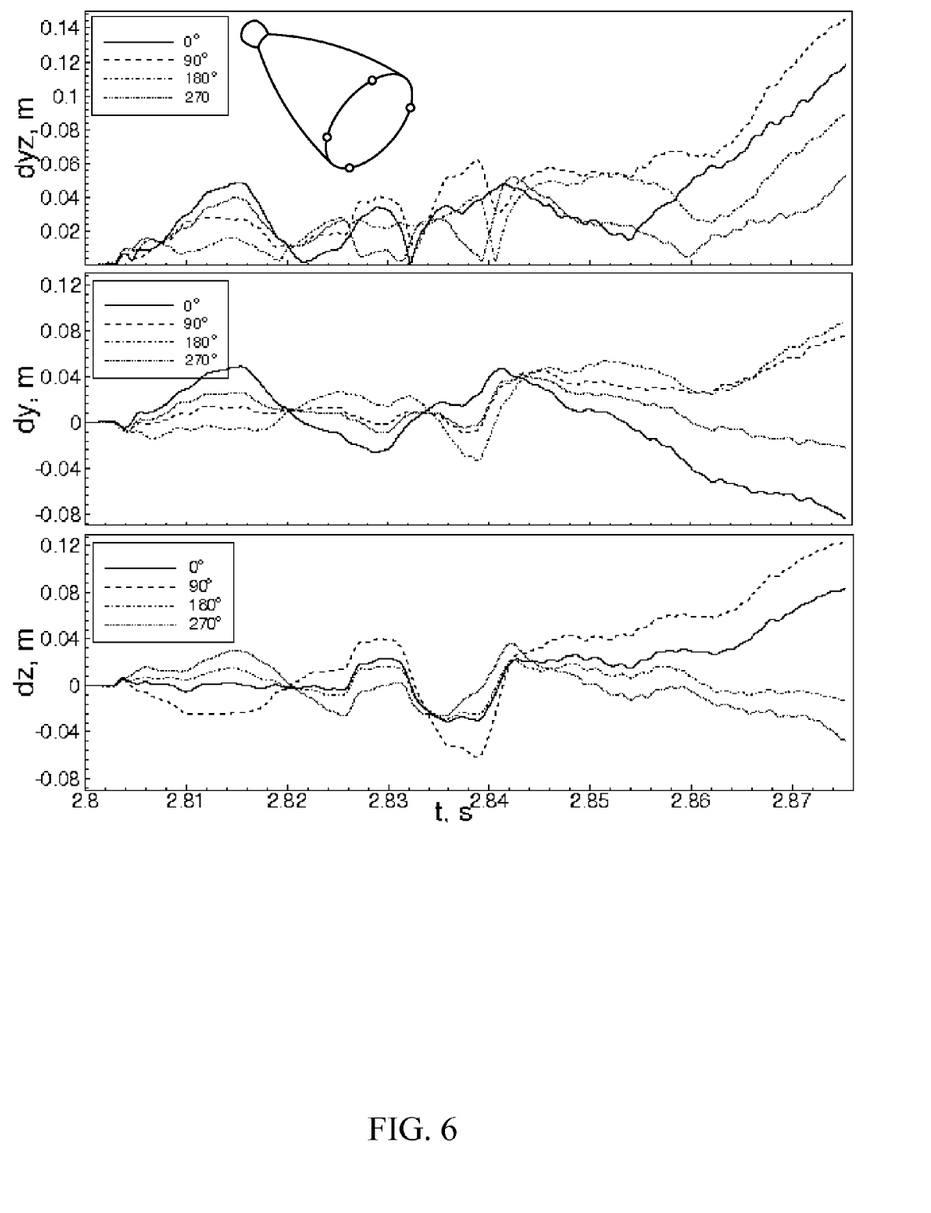
FIG. 6 presents graphic illustrations of a nozzle's lateral displacement histories at four monitored points.

The transient solutions can be used at step 36 to generate image(s) (e.g., on display 104) of the nozzle at its various deformed states during start-up and/or shut-down transients. Exemplary images are shown in FIGS. 4 and 5. In FIG. 4, non-bold lines represent the nozzle outlet shape without deformation and the bold lines represent the predictions of the nozzle outlet shape at four exemplary time iterations or slices. FIG. 5 illustrates, for the same time slices used in FIG. 4, perspective views of the rocket nozzle where contour lines are used to represent nozzle deformation. Other types of data outputs could additionally or alternatively be generated without departing from the scope of the present invention. Such outputs could include graphic images, spreadsheet data, etc., that could then be evaluated by nozzle designers. For example, FIG. 6 presents graphic illustrations of lateral displacement histories at four evenly spaced points at the nozzle outlet. The various data or result outputs generated by the present invention could also be stored in memory devices without departing from the scope of the present invention.

Figure 7:
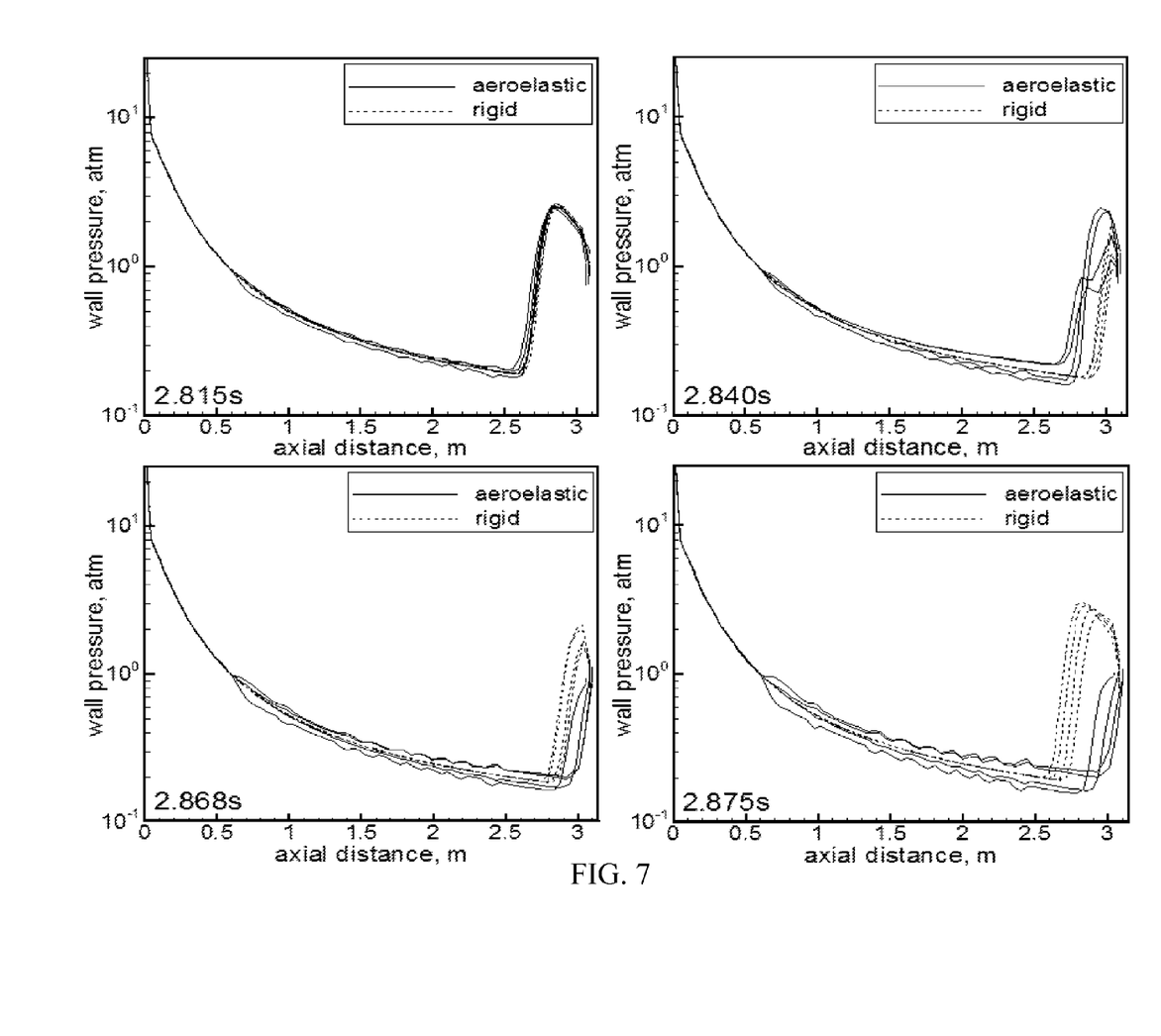
FIG. 7 presents graphic illustrations of a rocket nozzle's axial wall pressure profiles at the four quadrants of a nozzle during a start-up transient.

Since nozzle wall deformation affects the advancing Mach disk flow that, in turn, influences the interior wall pressures, axial wall pressure profile predictions can also be provided as an output. Accordingly, by way of example, FIG. 7 shows a comparison of the computed axial wall pressure profiles for the rigid nozzle and aeroelastic nozzle along the dividing lines of a rocket nozzle's four quadrants. These axial pressure profiles are taken at the nearest time slices of the four time slices used for the images presented in FIGS. 4 and 5. In the attached region, the difference in the axial wall pressure profiles between the rigid and aeroelastic nozzles is at its smallest at 2.815 seconds, then grows gradually at 2.840 seconds and 2.868 seconds, while the difference is at its largest at 2.875 seconds. This corresponds to the largest nozzle physical displacement. Thus, the difference in axial wall pressure profiles between the rigid and aeroelastic nozzles agrees well with the increased nozzle deformation discussed above. It is noted that in the attached flow region, the axial wall pressure profiles of the rigid nozzle appear to be enclosed by those of the aeroelastic nozzle. That is, the axial wall pressure profiles of the aeroelastic nozzle are either above or below those of the rigid nozzle showing the effect of nozzle wall deformation. The pressure profiles of the aeroelastic nozzle also show some waviness, while those of the rigid nozzle are smooth.

The advantages of the present invention are numerous. The present invention cures the inaccuracies and inefficiencies of loosely-coupled prediction tools by inserting the effects of mechanical eigenmodes directly into the fluid-structure interaction process. The mechanical eigenmodes of the structure need only be determined one time and inclusion directly into the fluid-structure interaction process avoids the need for interpolation at the fluid-structure interface. The new CFD process accounts for fluid-structure interface movement as well as afterburning effects using finite-rate chemistry. The small disturbances caused by the heat release of the afterburning reactions are believed to be the triggers of two peak side load physics, i.e., the shock transitions and the shock oscillations at the nozzle lip. Further, the present invention accounts for fluid-structure interface motion by determining new fluid mesh coordinates at each process step iteration.

Although the invention has been described relative to a specific embodiment thereof, there are numerous variations and modifications that will be readily apparent to those skilled in the art in light of the above teachings. It is therefore to be understood that the invention may be practiced other than as specifically described.

What is claimed as new and desired to be secured by Letters Patent of the United States is:

1. A method of predicting deformation of a rocket nozzle due to rocket engine combustion products flowing through the rocket nozzle during times associated with engine start-up and engine shut-down, comprising the steps of:
   providing structural parameters describing the rocket nozzle and wall geometry thereof;
   providing flow properties generated by the rocket engine combustion products and entering the rocket nozzle during the times associated with engine start-up and engine shut-down;
   providing a processing system that includes at least one processor for implementing a plurality of programmed processing steps and at least one output device for presenting results generated by said programmed processing steps;
   said programmed processing steps including
   performing computational fluid dynamics (CFD) computations at time increments using said structural parameters and said flow properties wherein said CFD computations describe a flowfield associated with the rocket engine combustion products flowing through the rocket nozzle, wherein each of said CFD computations accounts for movement of the wall geometry of the rocket nozzle due to said flowfield,
   performing structural dynamics computations at each of said time increments using said CFD computations wherein said structural dynamics computations describe the movement of the wall geometry, and
   performing mesh dynamics computations at each of said time increments to redefine said flowfield to account for the movement of the wall geometry, said mesh dynamics computations being based on a spring analogy process; and
   outputting results of said programmed processing steps for at least one of said time increments using said at least one output device.

2. A method according to claim 1, wherein said steps of performing are iterated for each of said time increments until a solution converges at each of said time increments.

3. A method according to claim 1, wherein said flow properties include profiles of pressure of the rocket engine combustion products entering the rocket nozzle, profiles of temperature of the rocket engine combustion products entering the rocket nozzle, and profiles of chemical species concentration associated with the rocket engine combustion products entering the rocket nozzle.

4. A method according to claim 1, wherein said CFD computations solve time-varying transport equations of continuity, species continuity equations, momentum equations, total enthalpy equations, turbulent kinetic energy equations, and turbulent kinetic energy dissipation equations.

5. A method according to claim 1, wherein said step of outputting includes the step of displaying images of said results of said programmed processing steps.

6. A method according to claim 1, wherein said spring analogy process includes a weighting function, said weighting function being greater than unity at the wall geometry of the rocket nozzle and transitioning to unity at a boundary layer edge in said flowfield.

7. A system for predicting deformation of a rocket nozzle due to rocket engine combustion products flowing through the rocket nozzle during times associated with engine start-up and engine shut-down, comprising:
   a processing system that includes at least one processor for implementing a plurality of programmed processing steps and at least one database for storage of data needed by said programmed processing steps, wherein said data includes structural parameters describing the rocket nozzle and wall geometry thereof, and wherein said data includes flow properties generated by the rocket engine combustion products and entering the rocket nozzle during the times associated with engine start-up and engine shut-down,
   said programmed processing steps including
   performing computational fluid dynamics (CFD) computations at time increments using said structural parameters and said flow properties wherein said CFD computations describe a flowfield associated with the rocket engine combustion products flowing through the rocket nozzle, wherein each of said CFD computations accounts for movement of the wall geometry of the rocket nozzle due to said flowfield,
   performing structural dynamics computations at each of said time increments using said CFD computations wherein said structural dynamics computations describe the movement of the wall geometry, and
   performing mesh dynamics computations at each of said time increments to redefine said flowfield to account for the movement of the wall geometry, said mesh dynamics computations being based on a spring analogy; and at least one output device coupled to said processor for presenting results generated by said programmed processing steps for at least one of said time increments.

8. A system as in claim 7, wherein said steps of performing are iterated for each of said time increments until a solution converges at each of said time increments.

9. A system as in claim 7, wherein said flow properties include profiles of pressure of the rocket engine combustion products entering the rocket nozzle, profiles of temperature of the rocket engine combustion products entering the rocket nozzle, and profiles of chemical species concentration associated with the rocket engine combustion products entering the rocket nozzle.

10. A system as in claim 7, wherein said CFD computations solve time-varying transport equations of continuity, species continuity equations, momentum equations, total enthalpy equations, turbulent kinetic energy equations, and turbulent kinetic energy dissipation equations.

11. A system as in claim 7, wherein said at least one output device is selected from the group consisting of devices that present said results in a viewable format and devices that store said results.

12. A system as in claim 7, wherein said programmed process includes a weighting function, said weighting function being greater than unity at the wall geometry of the rocket nozzle and transitioning to unity at a boundary layer edge in said flowfield.

* * * * *